United States Patent
Kim et al.

(10) Patent No.: US 9,071,232 B2
(45) Date of Patent: Jun. 30, 2015

(54) INTEGRATED CIRCUIT WITH RING OSCILLATOR

(71) Applicants: SK hynix Inc., Gyeonggi-do (KR); Seoul National University R&DB Foundation, Seoul (KR)

(72) Inventors: Kwan-Dong Kim, Gyeonggi-do (KR); Suhwan Kim, Seoul (KR); Gi-Moon Hong, Seoul (KR)

(73) Assignees: SK Hynix Inc., Gyeonggi-do (KR); Seoul National University R&DB Foundation, Seoul (KR)

( * ) Notice: Subject to any disclaimer, the term of this patent is extended or adjusted under 35 U.S.C. 154(b) by 37 days.

(21) Appl. No.: 13/906,013

(22) Filed: May 30, 2013

(65) Prior Publication Data

US 2014/0132360 A1    May 15, 2014

(30) Foreign Application Priority Data

Nov. 14, 2012    (KR) .......................... 10-2012-0128985

(51) Int. Cl.
*H03K 3/03*    (2006.01)
*H03L 7/085*    (2006.01)
*H03L 7/099*    (2006.01)
*H03L 7/087*    (2006.01)

(52) U.S. Cl.
CPC ............ *H03K 3/0322* (2013.01); *H03L 7/0995* (2013.01); *H03L 7/087* (2013.01)

(58) Field of Classification Search
CPC .... H03K 3/0315; H03K 3/0322; H03L 7/087; H03L 7/0995
USPC .......................................... 331/57, 34, 11, 12
See application file for complete search history.

(56) References Cited

U.S. PATENT DOCUMENTS 7,126,432 B2 *    10/2006    Roubadia et al. ............... 331/57

* cited by examiner

*Primary Examiner* — Ryan Johnson
(74) *Attorney, Agent, or Firm* — IP & T Group LLP

(57) ABSTRACT

An integrated circuit includes a ring oscillator including delay cells having a delay value and configured to generate two or more periodic waves, a first phase controller configured to compare the phase of a first selected periodic wave to the phase of a reference wave and change the delay value of the delay cells from a first delay value to a second delay value based on a first comparison signal corresponding to a phase difference between the first selected periodic wave and the reference wave, and a second phase controller configured to compare the phase of a second selected periodic wave to the phase of the reference wave and restore the delay value of the delay cells from the second delay value to the first delay value based on a second comparison signal corresponding to a phase difference between the second selected periodic wave and the reference wave.

18 Claims, 5 Drawing Sheets

INTEGRATED CIRCUIT WITH RING OSCILLATOR

CROSS-REFERENCE TO RELATED APPLICATIONS

The present application claims priority of Korean Patent Application No. 10-2012-0128985, filed on Nov. 14, 2012, which is incorporated herein by reference in its entirety.

BACKGROUND

1. Field

Exemplary embodiments of the present invention relate to semiconductor design technology, and more particularly, to an integrated circuit with ring oscillator.

2. Description of the Related Art

In general, a semiconductor device such as double data rate synchronous DRAM (DDR SDRAM) includes a variety of circuits to perform various circuit operations. The variety of circuits may include a ring oscillator.

FIG. 1 is a diagram illustrating a conventional ring oscillator.

The ring oscillator includes two delay cells 10_1 and 10_2 to delay an input signal and generates first to fourth oscillating clock signals $\phi1$ to $\phi4$. The configuration and operation of the ring oscillator are well known to those skilled in the art to which the present invention pertains. Therefore, the detailed descriptions thereof are omitted herein. The first and third clock signals $\phi1$ and $\phi3$ are 180 degrees out-of-phase with each other, and the second and fourth clock signals $\phi2$ and $\phi4$ are 180 degrees out-of-phase with each other. That is, based on the first clock signal $\phi1$, the second clock signal $\phi2$ has a phase difference of 90 degrees, the third clock signal $\phi3$ has a phase difference of 180 degrees, and the fourth clock signal $\phi4$ has a phase difference of 270 degrees.

Meanwhile, when the ring oscillator is in a clock synchronization circuit such as a phase locked loop (PLL), the clock signals $\phi1$ to $\phi4$ may be used as reference signals for adjusting various operation timings of the semiconductor device. Depending on cases, the phases of the clock signals $\phi1$ to $\phi4$ need to be shifted by a predetermined amount.

SUMMARY

Various embodiments of the present invention are directed to an integrated circuit that may generate periodic waves and change the phases of the generated periodic waves, while limiting an increase in the chip area.

In an embodiment, an integrated circuit includes a ring oscillator configured to include one or more delay cells having a delay value and to generate two or more periodic waves, a first phase controller configured to compare the phase of a first selected periodic wave, selected among the periodic waves, to the phase of a reference wave, and to change the delay value of the delay cells from a first delay value to a second delay value based on a first comparison signal, which corresponds to a phase difference between the first selected periodic wave and the reference wave, and a second phase controller configured to compare the phase of a second selected periodic wave, selected among the periodic waves, to the phase of the reference wave, and to restore the delay value of the delay cells from the second delay value to the first delay value based on a second comparison signal, which corresponds to a phase difference between the second selected periodic wave and the reference wave, wherein a period required for restoring the delay value of the delay cells to the first delay value corresponds to an interval from a time point when an activation period of the first comparison signal starts to a time point when an activation period of the second comparison signal ends.

In another embodiment, an integrated circuit includes a ring oscillator configured to include one or more delay cells having a delay value and to generate two or more periodic waves, and a phase controller configured to change the delay value of the delay cells from a first delay value to a second delay value during a first period, and then to restore the changed delay value to the first delay value, thereby shifting phases of the periodic waves.

DETAILED DESCRIPTION

Figure 1:
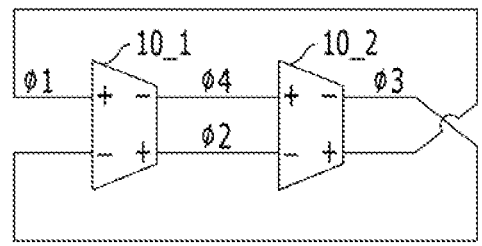
FIG. 1 is a diagram illustrating a conventional ring oscillator.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
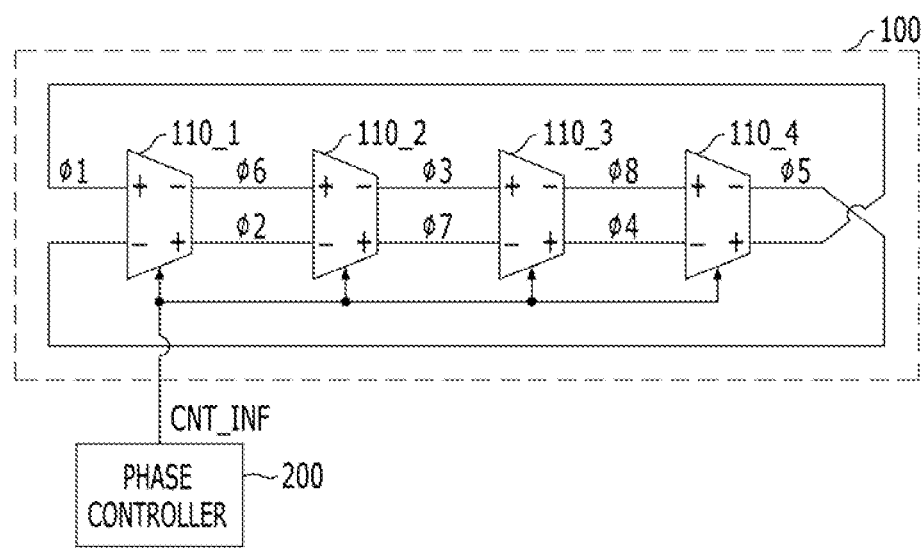
FIG. 2 is a diagram illustrating an integrated circuit in accordance with an embodiment of the present invention.

FIG. 2 is a diagram illustrating an integrated circuit in accordance with an embodiment of the present invention.

The integrated circuit in accordance with the embodiment of the present invention may include a ring oscillator 100 and a phase controller 200.

The ring oscillator 100 includes one or more delay cells 110_1 to 110_4 having a delay value, and is configured to generate periodic waves $\phi1$ to $\phi8$. For convenience of description, FIG. 2 illustrates a case in which the ring oscillator 100 includes first to fourth delay cells 110_1 to 110_4 and generates first to eighth periodic waves $\phi1$ to $\phi8$. The first to eighth periodic waves $\phi1$ to $\phi8$ have the same frequency and a predetermined phase difference from each other. For example, the phase of the first periodic wave φ1 leads the phase of the second periodic wave φ2 by a predetermined amount α, and the phase of the second periodic wave φ2 leads the phase of the third periodic wave φ3 by the amount α. Meanwhile, when the delay value of the delay cells 110_1 to 110_4 is increased, the phase difference (or the amount α) between the periodic waves φ1 to φ8 increases. Accordingly, the period of the periodic waves φ1 to φ8 may momentarily increase, and the frequency of the periodic waves φ1 to φ8 may momentarily decrease. Similarly, when the delay value of the delay cells 110_1 to 110_4 is decreased, the phase difference (or the amount α) between the periodic waves φ1 to φ8 decreases. Accordingly, the period of the periodic waves φ1 to φ8 may momentarily decrease, and the frequency of the periodic waves φ1 to φ8 may momentarily increase. Meanwhile, the delay value of the delay cells 110_1 to 110_4 are controlled based on control information CNT_INF outputted from the phase controller 200.

The phase controller 200 is configured to momentarily increase or decrease the delay value of the delay cells 110_1 to 110_4 and shift the phases of the periodic waves φ1 to φ8. That is, the phase controller 200 changes the delay value of the delay cells 110_1 to 110_4 from a first delay value to a second delay value for a short time, and restores the delay value to the first delay value, in order to shift the phases of the periodic waves φ1 to φ8. For example, when the second delay value is larger than the first delay value, the phases of the periodic waves φ1 to φ8 are shifted right, and when the second delay value is smaller than the first delay value, the phases of the periodic waves φ1 to φ8 are shifted left. Specifically, the phase controller 200 may be designed to generate the control information CNT_INF for controlling the delay value of the delay cells 110_1 to 110_4 and output the generated control information to the ring oscillator 100. The phase controller 200 momentarily changes the delay value of the delay cells 110_1 to 110_4 and momentarily changes the frequency of the periodic waves φ1 to φ8. When the frequency of the periodic waves φ1 to φ8 is momentarily changed, the phases of the periodic waves φ1 to φ8 are shifted left or right by a predetermined amount. For example, when the frequency of the periodic waves φ1 to φ8 is momentarily increased from 10 MHz to 12 MHz, rising edges of the periodic waves φ1 to φ8 occur earlier than when the frequency is 10 MHz. That is, the rising edges of the periodic waves φ1 to φ8 are shifted left. Similarly, when the frequency of the periodic waves φ1 to φ8 is momentarily decreased from 10 MHz to 8 MHz, the rising edges of the periodic waves φ1 to φ8 occur later than when the frequency is 10 MHz. That is, the rising edges of the periodic waves φ1 to φ8 are shifted right. Furthermore, the phase controller 200 momentarily changes the delay value of the delay cells 110_1 to 110_4, and then controls the changed delay value such that the delay cells 110_1 to 110_4 have the same delay value as before the delay value was changed. Accordingly, the periodic waves φ1 to φ8 have the same frequency as before the frequency was changed. For example, when the phase controller 200 momentarily changes the frequency of the periodic waves φ1 to φ8 from 10 MHz to 12 MHz, and then controls the frequency to be restored to 10 MHz. As a result, based on the control of the phase controller 200, the phases of the periodic waves φ1 to φ8 generated by the ring oscillator 100 are shifted left or right while the periodic waves φ1 to φ8 have the same frequency of 10 MHz as before the frequency was changed.

Figure 3:
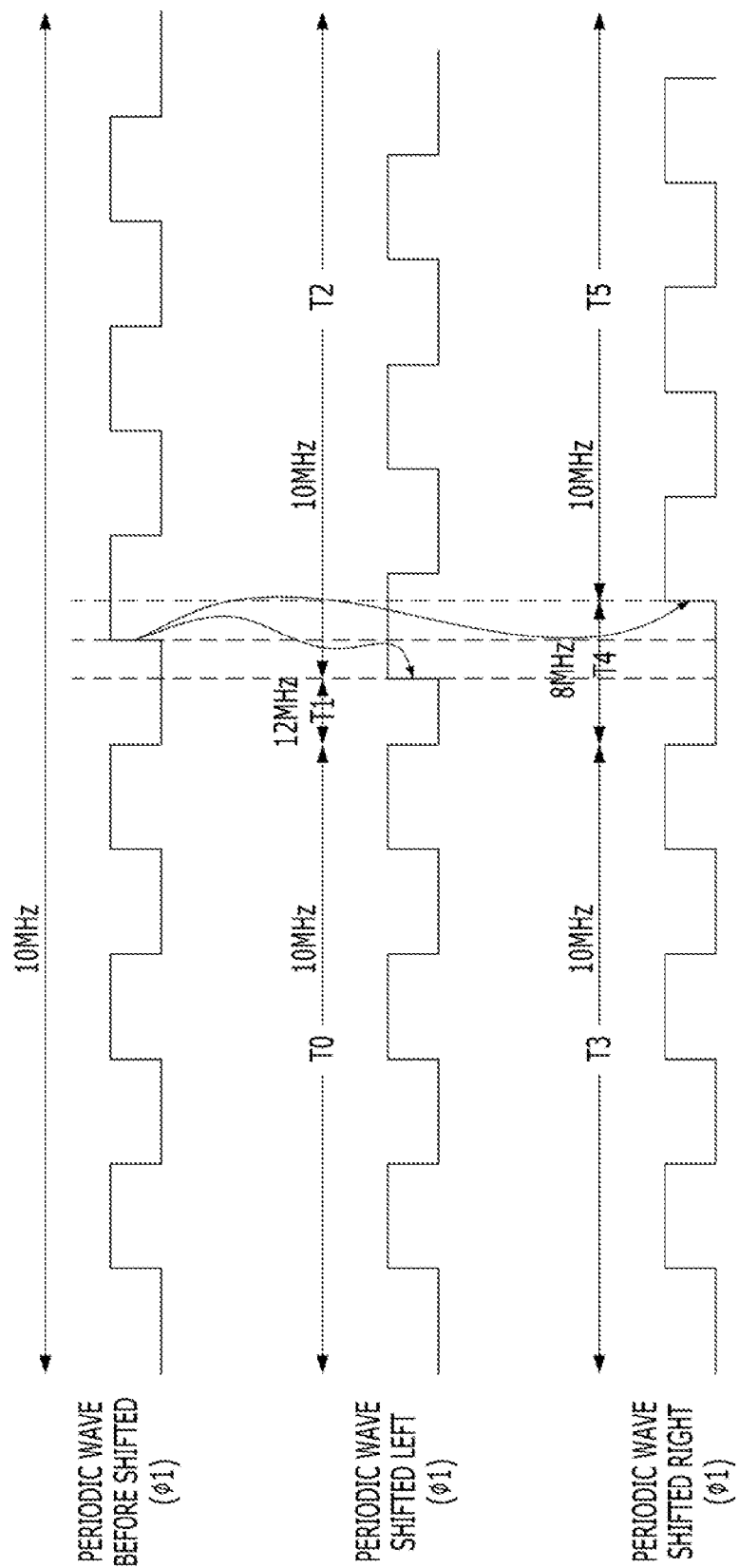
FIG. 3 is a waveform diagram illustrating a periodic wave $\phi1$ of which the phase is shifted by the integrated circuit shown in FIG. 2.

FIG. 3 is a waveform diagram illustrating the periodic wave φ1 of which the phase is shifted by the integrated circuit shown in FIG. 2. For convenience of description, FIG. 3 illustrates a case in which the periodic wave φ1 has a frequency of 10 MHz before the phase of the periodic wave φ1 is shifted.

Firstly, when the phase of the periodic wave φ1 is intended to be shifted left, the delay value of the delay cells 110_1 to 110_4 may be momentarily decreased. Specifically, during a period T0, the ring oscillator 100 generates the periodic wave φ1 having a frequency of 10 MHz. Furthermore, the phase controller 200 generates the control information CNT_INF to decrease the delay value of the delay cells 110_1 to 110_4 by a predetermined value β1 during a period T1, and outputs the generated information to the ring oscillator 100. The delay value of the delay cells 110_1 to 110_4 of the ring oscillator 100 is momentarily decreased based on the control information CNT_INF. As a result, the frequency of the periodic wave φ1 generated from the ring oscillator 100 during the period T1 becomes 12 MHz. Furthermore, the phase controller 200 generates the control information CNT_INF to increase the delay value of the delay cells 110_1 to 110_4 by the value β1 during a period T2, and outputs the generated information to the ring oscillator 100. The delay value of the delay cells 110_1 to 110_4 is increased by the value β1 based on the control information CNT_INF, and the delay value of the delay cells 110_1 to 110_4 during the period T2 is equalized to the delay value of the delay cells 110_1 to 110_4 during the period T0. Accordingly, the frequency of the periodic wave φ1 generated from the ring oscillator 100 during the period T2 becomes 10 MHz. As a result, the phase of the periodic wave φ1 is shifted left, while the periodic wave φ1 has the same frequency of 10 MHz as before the frequency was changed.

Meanwhile, when the phase of the periodic wave φ1 is intended to be shifted right, the delay value of the delay cells 110_1 to 110_4 may be momentarily increased. Specifically, during a period T3, the ring oscillator 100 generates the periodic wave φ1 having a frequency of 10 MHz. Furthermore, the phase controller 200 generates the control information CNT_INF to increase the delay value of the delay cells 110_1 to 110_4 by a predetermined value β2 during a period T4, and outputs the generated information to the ring oscillator 100. The delay value of the delay cells 110_1 to 110_4 of the ring oscillator 100 is momentarily increased based on the control information CNT_INF. As a result, the frequency of the periodic wave φ1 generated from the ring oscillator 100 during the period T4 becomes 8 MHz. Furthermore, the phase controller 200 generates the control information CNT_INF to decrease the delay value of the delay cells 110_1 to 110_4 by the value β2 during a period T5, and outputs the generated information to the ring oscillator 100. The delay value of the delay cells 110_1 to 110_4 is decreased by the value β2 based on the control information CNT_INF, and the delay value of the delay cells 110_1 to 110_4 during the period T5 is equalized to the delay value of the delay cells 110_1 to 110_4 during the period T3. Accordingly, the frequency of the periodic wave φ1 generated from the ring oscillator 100 during the period T5 becomes 10 MHz. As a result, the phase of the periodic wave φ1 is shifted right, while the periodic wave φ1 has the same frequency of 10 MHz as before the frequency was changed.

Meanwhile, the method for controlling the delay value of the delay cells 110_1 to 110_4 may be modified in various manners. Hereafter, a method for controlling the delay value of the delay cells 110_1 to 110_4 by controlling the amount of current flowing in the delay cells 110_1 to 110_4 will be taken an example for description.

Figure 4:
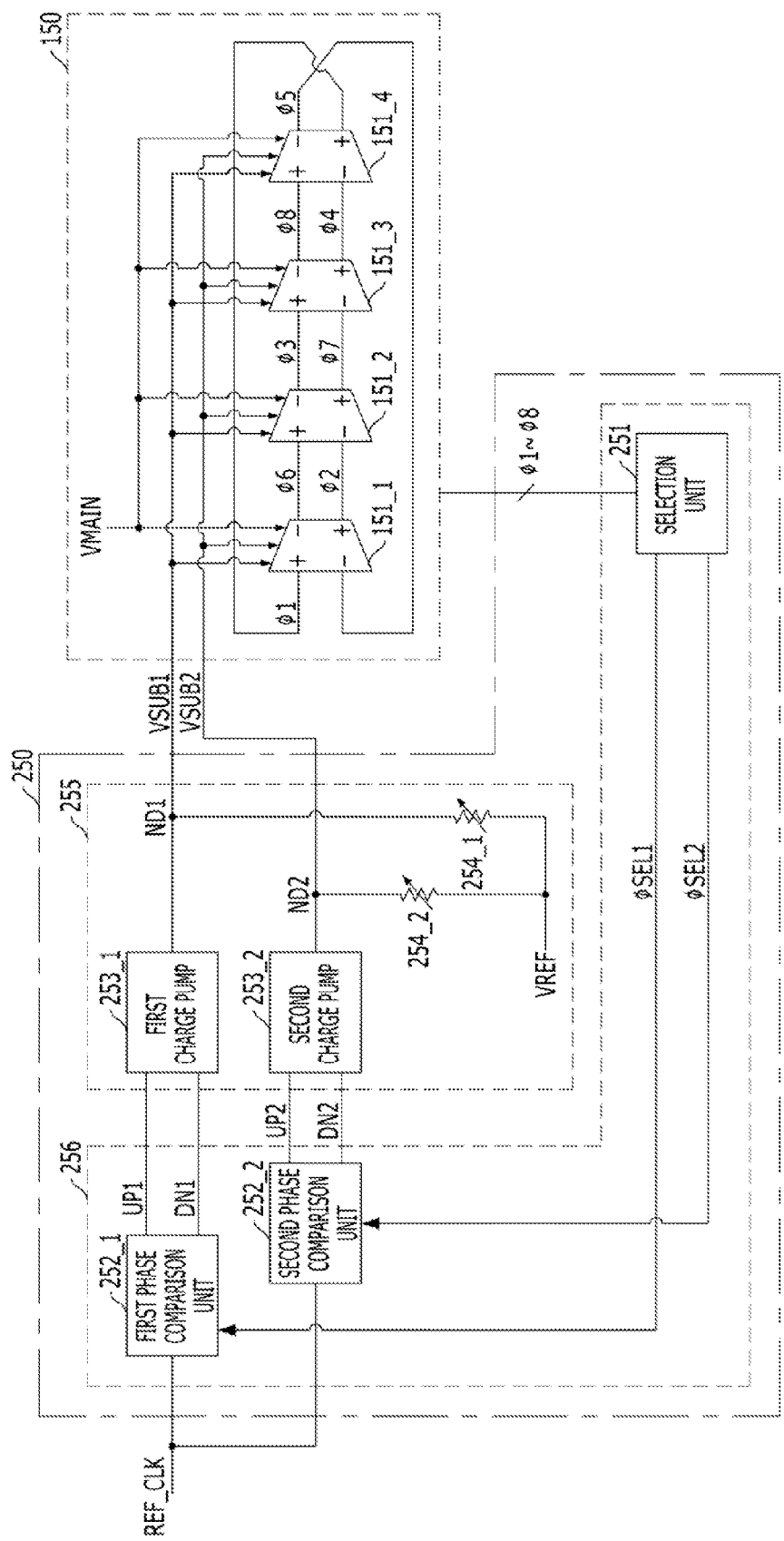
FIG. 4 is a diagram illustrating an integrated circuit in accordance with another embodiment of the present invention.

FIG. 4 is a diagram illustrating an integrated circuit in accordance with another embodiment of the present invention.

The integrated circuit in accordance with the embodiment of the present invention includes a ring oscillator 150 and a phase controller 250.

The ring oscillator 150 includes one or more delay cells 151_1 to 151_4 having a delay value corresponding to the amount of current flowing therein, and is configured to generate a plurality of periodic waves φ1 to φ8. For convenience of description, FIG. 4 illustrates a case in which the ring oscillator 150 includes four delay cells 151_1 to 151_4 and generates eight periodic waves φ1 to φ8. Here, the eight periodic waves φ1 to φ8 have the same frequency and a predetermined phase difference from each other. Specifically, each of the fourth delay cells 151_1 to 151_4 may be designed to control the flowing current amount based on a main control voltage VMAIN, a first sub control voltage VSUB1, and a second sub control voltage VSUB2. The configuration of the delay cell 151_1 will be described in detail with reference to FIG. 5.

The phase controller 150 is configured to momentarily increase or decrease the amount of current flowing in the delay cells 151_1 to 151_4 and change the phases of the periodic waves φ1 to φ8. Specifically, the phase controller 150 changes the delay value of the delay cells 151_1 to 151_4 from a first delay value to a second delay value during a first period corresponding to a short time, and then restores the changed delay value to the first delay value, to shift the phases of the periodic waves φ1 to φ8. For example, the second delay value may be larger than the first delay value. In this case, the phases of the periodic waves φ1 to φ8 are shifted right. Meanwhile, the phase controller 150 controls the levels of the first and second sub control voltages VSUB1 and VSUB2, changes the amount of current flowing in the delay cells 151_1 to 151_4 from a first current amount to a second current amount during the first period, and then restores the current amount to the first current amount, to shift the phases of the periodic waves φ1 to φ8. The first current amount corresponds to the first delay value, and the second current amount corresponds to the second delay value. The phase controller 150 may include a phase comparison circuit 256 and a sub control voltage control unit 255.

The phase comparison circuit 256 is configured to compare the phases of two periodic waves among the eight periodic waves φ1 to φ8 generated from the ring oscillator 150 to the phase of a reference wave REF_CLK, generate a first up/down signal UP1/DN2 and a second up/down signal UP2/DN2 corresponding to the phase differences, and outputs the generated signals to the sub control voltage control unit 255. Specifically, the phase comparison circuit 256 may include a selection unit 251, a first phase comparison unit 252_1, and a second phase comparison unit 252_2. The selection unit 251 is configured to receive the eight periodic waves φ1 to φ8 generated by the ring oscillator 150 and select two periodic waves from the received periodic waves. The selection unit 251 may be designed to select two adjacent periodic waves among the eight periodic waves φ1 to φ8, that is, two periodic waves having the smallest phase difference. For example, the selection unit 251 may be designed to select the first and second periodic waves φ1 and φ2, the second and third periodic waves φ2 and φ3, the third and fourth periodic waves φ3 and φ4, the fourth and fifth periodic waves φ4 and φ5, the fifth and sixth periodic waves φ5 and φ6, the sixth and seventh periodic waves φ6 and φ7, the seventh and eight periodic waves φ7 and φ8, or the eight and first periodic waves φ8 and φ1, among the eight periodic waves φ1 to φ8. Meanwhile, since the selection unit 251 is not a necessary component in the embodiment of the present invention, the phase comparison circuit 256 may be designed to input the first periodic wave φ1 generated by the ring oscillator 150 to the first phase comparison unit 252_1 and to input the second periodic wave φ2 to the second phase comparison unit 252_2, without the selection unit 251.

The first phase comparison unit 252_1 is configured to compare the phase of a first selected periodic wave φSEL1 selected by the selection unit 251 to the phase of the reference wave REF_CLK, activate the first down signal DN1 when the phase of the first selected periodic wave φSEL1 leads the phase of the reference wave REF_CLK, and activate the first up signal UP1 when the phase of the reference wave REF_CLK leads the phase of the first selected periodic wave φSEL1. The phase of the reference wave REF_CLK is positioned between the phases of the first selected periodic wave φSEL1 and a second selected periodic wave φSEL2. Meanwhile, activation period lengths of the first up signal UP1 and the first down signal DN1 may differ depending on the phase difference between the reference wave REF_CLK and the first selected periodic wave φSEL1. That is, when the reference wave REF_CLK and the first selected periodic wave φSEL1 have a relatively large phase difference, the activation period length of the first up signal UP1 or the first down signal DN1 relatively increases. On the other hand, when the reference wave REF_CLK and the first selected periodic wave φSEL1 have a relatively small phase difference, the activation period length of the first up signal UP1 or the first down signal DN1 relatively decreases.

The phase comparison unit 252_2 is configured to compare the phase of the second selected periodic wave φSEL2 selected by the selection unit 251 to the phase of the reference wave REF_CLK, and generate the second up signal UP2 or the second down signal DN2. The configuration and operation of the second phase comparison unit 252_2 are similar to those of the first phase comparison unit 252_1.

Meanwhile, when the phase of the first selected periodic wave φSEL1 leads the phase of the second selected periodic wave φSEL2, the first phase comparison unit 252_1 performs the comparison operation before the second phase comparison unit 252_2. For example, when the first selected periodic wave φSEL1 is the first periodic wave φ1 and the second selected periodic wave φSEL2 is the second periodic wave φ2, the phase of the first selected periodic wave φSEL1 leads the phase of the second selected periodic wave φSEL2. Therefore, the first phase comparison unit 252_1 performs the comparison operation before the second phase comparison unit 252_2. Meanwhile, when the phase of the second selected periodic wave φSEL2 leads the phase of the first selected periodic wave φSEL1, the second phase comparison unit 252_2 performs the comparison operation before the first phase comparison unit 252_1.

Meanwhile, the first period may correspond to an interval from a time point when the activation period of the first down signal DN1 starts to a time point when the activation period of the second up signal UP2 ends.

When the phase of the first selected periodic wave φSEL1 leads the phase of the reference wave REF_CLK and the phase of the reference wave REF_CLK leads the phase of the second selected periodic wave φSEL2, the first down signal DN1 is activated before the second up signal UP2. Therefore, the sub control voltage control unit 255 decreases the level of the first sub control voltage VSUB1 corresponding to the voltage of a first node ND1 by a predetermined amount γ in response to the first down signal DN1, and then increases the level of the second sub control voltage VSUB2 corresponding to the voltage of a second node ND2 by the amount γ in response to the second up signal UP2. Here, the amount γ corresponds to a difference between the first and second delay values or a difference between the first and second current amounts.

Furthermore, when the phase of the second selected periodic wave φSEL2 leads the phase of the reference wave REF_CLK and the phase of the reference wave REF_CLK leads the phase of the first selected periodic wave φSEL1, the second down signal DN2 is activated before the first up signal UP1. Therefore, the sub control voltage control unit 255 decreases the level of the second sub control voltage VSUB2 corresponding to the voltage of the second node ND2 in response to the second down signal DN2 by the amount γ, and then increases the level of the first sub control voltage VSUB1 corresponding to the voltage of the first node ND1 in response to the first up signal UP1 by the amount γ.

Specifically, the sub control voltage control unit 255 may include a first charge pump 253_1, a second charge pump 253_2, a first resistor unit 254_1, and a second resistor unit 254_2.

The first charge pump 253_1 is configured to supply a current having an amount corresponding to the activation period length of the first up signal UP1 to the first node ND1 or draw a current having an amount corresponding to the activation period length of the first down signal DN1 from the first node ND1.

The first resistor unit 254_1 has one end configured to receive a reference voltage VREF and the other end connected to the first node ND1. The resistance value of the first resistor unit 254_1 is adjusted to a resistance value corresponding to a ratio occupied by the activation period length of the second up signal UP2 in the sum of the activation period lengths of the first down signal DN1 and the second up signal UP2 based on a reference resistance value or a resistance value corresponding to a ratio occupied by the activation period length of the second down signal DN2 in the sum of the activation period lengths of the first up signal UP1 and the second down signal DN2 based on the reference resistance value. Specifically, when the phase of the first selected periodic wave φSEL1 leads the phase of the reference wave REF_CLK and the phase of the reference wave REF_CLK leads the phase of the second selected periodic wave φSEL2, the first resistor unit 254_1 has a resistance value as expressed by Equation 1 below. Furthermore, when the phase of the second selected periodic wave φSEL2 leads the phase of the reference wave REF_CLK and the phase of the reference wave REF_CLK leads the phase of the first selected periodic wave φSEL1, the first resistor unit 254_1 has a resistance value as expressed by Equation 2 below.

$$R1=R\_REF*\{LENTH\_EN\_UP2/(LENTH\_EN\_DN1+LENTH\_EN\_UP2)\} \quad \text{[Equation 1]}$$

Here, R1 represents the resistance value of the first resistor unit 254_1, R_REF represents the reference resistance value, LENTH_EN_UP2 represents the activation period length of the second up signal UP2, and LENTH_EN_DN1 represents the activation period length of the first down signal DN1.

$$R2=R\_REF*\{LENTH\_EN\_DN2/(LENTH\_EN\_UP1+LENTH\_EN\_DN2)\} \quad \text{[Equation 2]}$$

Here, LENTH_EN_DN2 represents the activation period length of the second down signal DN2, and LENTH_EN_UP1 represents the activation period length of the first up signal UP1.

Meanwhile, the first resistor unit 254_1 may be designed to include a plurality of resistors connected in series and a plurality of switches. This configuration will be described in detail with reference to FIG. 6.

The second charge pump 253_2 is configured to supply a current having an amount corresponding to the activation period length of the second up signal UP2 to the second node ND2 or draw a current having an amount corresponding to the activation period length of the second down signal DN2 from the second node ND2.

The second resistor unit 254_2 has one end configured to receive the reference voltage VREF and the other end connected to the second node ND2. The resistance value of the second resistor unit 254_2 is adjusted to a resistance value corresponding to a ratio occupied by the activation period length of the first down signal DN1 in the sum of the activation period lengths of the first down signal DN1 and the second up signal UP2 based on the reference resistance value or a resistance value corresponding to a ratio occupied by the activation period length of the first up signal UP1 in the sum of the activation period lengths of the first up signal UP1 and the second down signal DN2 based on the reference resistance value.

Specifically, when the phase of the first selected periodic wave φSEL1 leads the phase of the reference wave REF_CLK and the phase of the reference wave REF_CLK leads the phase of the second selected periodic wave φSEL2, the second resistor unit 254_2 has a resistance value as expressed by Equation 3 below. Furthermore, when the phase of the second selected periodic wave φSEL2 leads the phase of the reference wave REF_CLK and the phase of the reference wave REF_CLK leads the phase of the first selected periodic wave φSEL1, the second resistor unit 254_2 has a resistance value as expressed by Equation 4 below.

$$R2=R\_REF*\{LENTH\_EN\_DN1/(LENTH\_EN\_DN1+LENTH\_EN\_UP2)\} \quad \text{[Equation 3]}$$

Here, R2 represents the resistance value of the second resistor unit 254_2.

$$R2=R\_REF*\{LENTH\_EN\_UP1/(LENTH\_EN\_UP1+LENTH\_EN\_DN2)\} \quad \text{[Equation 4]}$$

The resistance value R1 of the first resistor unit 254_1 and the resistance value R2 of the second resistor unit 254_2 will be described by referring to a specific example. For convenience of description, the unit of a phase difference between the selected period periodic wave φSEL1 or φSEL2 and the reference wave REF_CLK and the unit of the activation period lengths of the up signals UP1 and UP2 and the down signals DN1 and DN2 are omitted. Furthermore, it is assumed that the phase difference between the selected periodic wave φSEL1 or φSEL2 and the reference wave REF_CLK is proportional 1:1 to the activation period length of the up signal UP1 and UP2 or the down signals DN1 and DN2.

1. When the phase of the first selected periodic wave φSEL1 leads the phase of the reference wave REF_CLK by 1 and the phase of the reference wave REF_CLK leads the phase of the second selected periodic wave φSEL2 by 5, the activation period length LENTH_EN_DN1 of the first down signal DN1 correspond to 1, and the activation period length LENTH_EN_UP2 of the second up signal UP2 correspond to 5. As a result, the resistance value R1 of the first resistor unit 254_1 becomes {reference resistance value R_REF*5/6} according to Equation 1, and the resistance value R2 of the second resistor unit 254_2 becomes {reference resistance value R_REF*1/6} according to Equation 3.

2. When the phase of the second selected periodic wave φSEL2 leads the phase of the reference wave REF_CLK by 2 and the phase of the reference wave REF_CLK leads the phase of the first selected periodic wave φSEL1 by 4, the activation period length LENTH_EN_DN1 of the second down signal DN2 correspond to 2, and the activation period length LENTH_EN_UP1 of the first up signal UP1 correspond to 4. As a result, the resistance value R1 of the first resistor unit 254_1 becomes {reference resistance value R_REF*2/6} according to Equation 2, and the resistance value R2 of the second resistor unit 254_2 becomes {reference resistance value R_REF*4/6} according to Equation 4.

Meanwhile, when the phase of the first selected periodic wave φSEL1 leads the phase of the reference wave REF_CLK and the phase of the reference wave REF_CK leads the phase of the second selected periodic wave φSEL2, the voltage level of the first node ND1 is decreased to a voltage level as expressed by Equation 5 below by the first charge pump 253_1 and the first resistor unit 254_1. On the other hand, when the phase of the second selected periodic wave φSEL2 leads the phase of the reference wave REF_CLK and the phase of the reference wave REF_CK leads the phase of the first selected periodic wave φSEL1, the voltage level of the first node ND1 is increased to a voltage level as expressed by Equation 6 below.

$$VSUB1=VREF-I\_UNIT*LENTH\_EN\_DN1*R1 \quad \text{[Equation 5]}$$

Here, VSUB1 represents the voltage of the first node ND1, and I_UNIT represents an amount of current pumped by the charge pumps 253_1 and 253_2 per unit time.

$$VSUB1=VREF+I\_UNIT*LENTH\_EN\_UP1*R1 \quad \text{[Equation 6]}$$

Furthermore, when the phase of the first selected periodic wave φSEL1 leads the phase of the reference wave REF_CLK and the phase of the reference wave REF_CLK leads the phase of the second selected periodic wave φSEL2, the voltage level of the second node ND2 is increased to a voltage level as expressed by Equation 7 below by the second charge pump 253_2 and the second resistor unit 254_2. On the other hand, when the phase of the second selected periodic wave φSEL2 leads the phase of the reference wave REF_CLK and the phase of the reference wave REF_CLK leads the phase of the first selected periodic wave φSEL1, the voltage level of the second node ND2 is decreased to a voltage level as expressed by Equation 8 below.

$$VSUB2=VREF+I\_UNIT*LENTH\_EN\_UP2*R2 \quad \text{[Equation 7]}$$

Here, VSUB2 represents the voltage of the second node ND2.

$$VSUB2=VREF-I\_UNIT*LENTH\_EN\_DN2*R2 \quad \text{[Equation 8]}$$

Meanwhile, when the phase of the first selected periodic wave φSEL1 leads the phase of the reference wave REF_CLK and the phase of the reference wave REF_CLK leads the phase of the second selected periodic wave φSEL2, the voltage of the first node ND1 (first sub control voltage VSUB1) may be expressed as follows, based on Equations 1 and 5:

$$VSUB1=VERF-I\_UNIT*LENTH\_EN\_DN1*R1=VREF-I\_UNIT*LENTH\_EN\_DN1*R\_REF*\{LENTH\_EN\_UP2/(LENTH\_EN\_DN1+LENTH\_EN\_UP2)\}.$$

Furthermore, the voltage of the second node ND2 (second sub control voltage VSUB2) is expressed as follow, based on Equations 3 and 7:

$$VSUB2=VREF+I\_UNIT*LENTH\_EN\_UP2*R2=VREF+I\_UNIT*LENTH\_EN\_UP2*R\_REF*\{LENTH\_EN\_DN1/(LENTH\_EN\_DN1+LENTH\_EN\_UP2)\}.$$

As a result, the voltage variation of the first sub control voltage VSUB1 and the voltage variation of the second sub control voltage VSUB2 have different signs, but have the same amount of I_UNIT*LENTH_EN_DN1*R_REF*{LENTH_EN_UP2/(LENTH_EN_DN1+LENTH_EN_UP2)}.

Meanwhile, when the phase of the second selected periodic wave φSEL2 leads the phase of the reference wave REF_CLK and the phase of the reference wave REF_CLK leads the phase of the first selected periodic wave φSEL1, the voltage of the first node ND1 (first sub control voltage VSUB1) may be expressed as follows, based on Equations 2 and 6:

$$VSUB1=VREF+I\_UNIT*LENTH\_EN\_UP1*R1=VREF+I\_UNIT*LENTH\_EN\_UP1*R\_REF*\{LENTH\_EN\_DN2/(LENTH\_EN\_UP1+LENTH\_EN\_DN2)\}.$$

Furthermore, the voltage of the second node ND2 (second sub control voltage VSUB2) may be expressed as follows, based on Equations 4 and 8:

$$VSUB2=VREF-I\_UNIT*LENTH\_EN\_DN2*R2=VREF-I\_UNIT*LENTH\_EN\_DN2*R\_REF*\{LENTH\_EN\_UP1/(LENTH\_EN\_UP1+LENTH\_EN\_DN2)\}.$$

As a result, the voltage variation of the first sub control voltage VSUB1 and the voltage variation of the second sub control voltage VSUB2 have different signs, but have the same amount of I_UNIT*LENTH_EN_DN2*R_REF*{LENTH_EN_UP1/(LENTH_EN_UP1+LENTH_EN_DN2)}.

Figure 5:
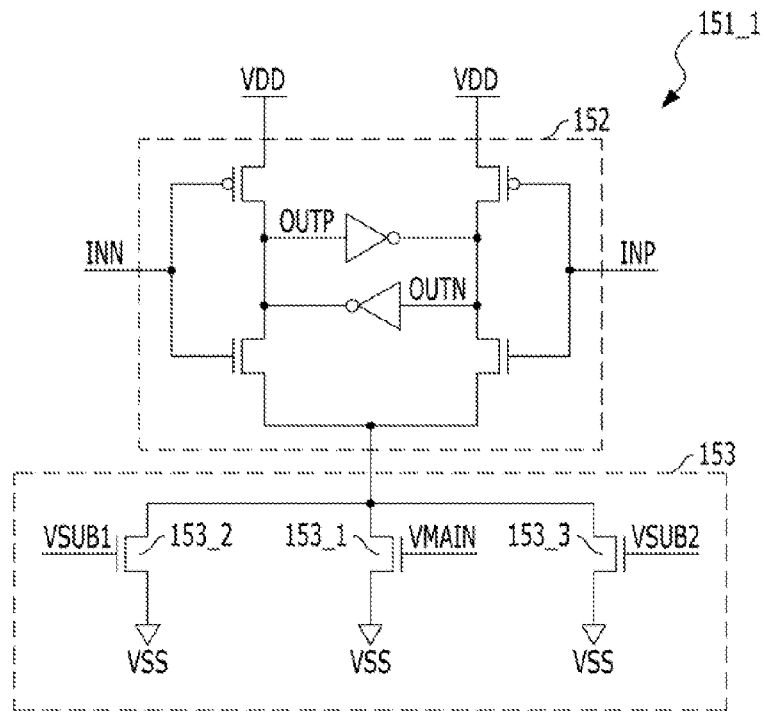
FIG. 5 is a detailed diagram illustrating a first delay cell shown in FIG. 4.

FIG. 5 is a detailed diagram illustrating the first delay cell 151_1 shown in FIG. 4.

The first delay cell 151_1 may include a delay unit 152 and a current source unit 153.

The delay unit 152 is configured to delay signals inputted to a positive input terminal INP and a negative input terminal INN by a delay value corresponding to an amount of current flowing therein and output the delayed signals to a positive output terminal OUTP and a negative output terminal OUTN, respectively. For example, the delay unit 152 delays the signal inputted to the positive input terminal INP by the delay value corresponding to the flowing current amount and outputs a high-level signal to the positive output terminal OUTP when the signal inputted to the positive input terminal INP is at a high level, and delays the signal inputted to the positive input terminal INP by the delay value and outputs a low-level signal to the positive output terminal OUTP when the signal inputted to the positive input terminal INP is at a low level. Meanwhile, the delay unit 152 delays the signal inputted to the negative input terminal INN by the delay value and outputs a high-level signal to the negative output terminal OUTN when the signal inputted to the negative input terminal INN is at a high level, and delays the signal inputted to the negative input terminal INN by the delay value and outputs a low-level signal to the negative output terminal OUTN when the signal inputted to the negative input terminal INN is at a low level. As the amount of current flowing in the delay unit 152 increases, the delay value of the delay unit 152 decreases, and as the amount of current flowing in the delay unit 152 decreases, the delay value of the delay unit 152 increases.

The current source unit 153 is configured to supply a current to the delay unit 152 based on control of the phase controller 250. The current source unit 153 may include a first current source 153_1, a second current source 153_2, and a third current source 153_3. The first current source 153_1 is configured to supply a current corresponding to the main control voltage VMAIN to the delay unit 152. The second current source 153_2 is configured to supply a current corresponding to the first sub control voltage VSUB1 to the delay unit 152. The third current source 153_3 is configured to supply a current corresponding to the second sub control voltage VSUB2 to the delay unit 152. The first current source 153_1 supplies a relatively large amount of current to the delay unit 152 as the level of the main control voltage VMAIN increases, and supplies a relatively small amount of current to the delay unit 152 as the level of the main control voltage VMAIN decreases. The main control voltage VMAIN may include a control voltage generated by an external phase locked loop (PLL) circuit. The second current source 153_2 supplies a relatively large amount of current to the delay unit 152 as the level of the first sub control voltage VSUB1 increases, and supplies a relatively small amount of current to the delay unit 152 as the level of the first sub control voltage VSUB1 decreases. The third current source 153_3 supplies a relatively large amount of current to the delay unit 152 as the level of the second sub control voltage VSUB2 increases, and supplies a relatively small amount of current to the delay unit 152 as the level of the second sub control voltage VSUB2 decreases.

When the level of the main control voltage VMAIN is not changed and the level of the first sub control voltage VSUB1 is decreased by the amount γ from the level of the reference voltage VREF, the second current source 153_2 supplies a smaller amount of current to the delay unit 152 than when the level of the first sub control voltage VSUB1 is equal to the level of the reference voltage VREF. Since the amount of current flowing in the delay unit 152 decreases, the delay value of the delay unit 152 increases. Accordingly, the phase difference between the eight periodic waves φ1 to φ8 outputted from the respective delay cells 151_1 to 151_4 increases to momentarily decrease the frequency of the periodic waves φ1 to φ8.

Meanwhile, when the level of the second sub control voltage VSUB2 is increased by the amount γ from the level of the reference voltage VREF after the first period passes from a time point when the level of the first sub control voltage VSUB1 is decreased, the current source 153_3 supplies a larger amount of current to the delay unit 152 than when the level of the second sub control voltage VSUB2 is equal to the level of the reference voltage VREF. Here, since the voltage variation of the second sub control voltage VSUB2 has a different sign from the voltage variation of the first sub control voltage VSUB1 but has the same amount as the voltage variation of the first sub control voltage VSUB1, the current flowing in the delay unit 152 is increased to the same amount as the current variation when the level of the first sub control voltage VSUB1 is decreased by the amount γ. As a result, the current having the same amount as before the level of the first sub control voltage VSUB1 was changed is passed to the delay unit 152, and the frequency of the periodic waves φ1 to φ8 outputted from the respective delay units 151_1 to 151_4 has the same amount as before the level of the first sub control voltage VSUB1 was changed. Here, an interval (first period) from a time point when the decrease of the first sub control voltage VSUB1 starts to a time point when the increase of the second sub control voltage VSUB2 ends may correspond to an interval from a time point when the activation period of the first down signal DN1 starts to a time point when the activation period of the second up signal UP2 ends. Therefore, since the first period corresponds to a short interval, the frequency of the periodic waves φ1 to φ8 outputted from the respective delay cells 151_1 to 151_4 may momentarily decrease and then restore to the same frequency as before the frequency was changed. For example, the frequency of the periodic waves φ1 to φ8 may momentarily decrease from 10 MHz to 8 MHz, and then restore to 10 MHz.

The second to fourth delay cells 151_2 to 151_4 may be configured in the same manner as the first delay cell 151_1.

Figure 6:
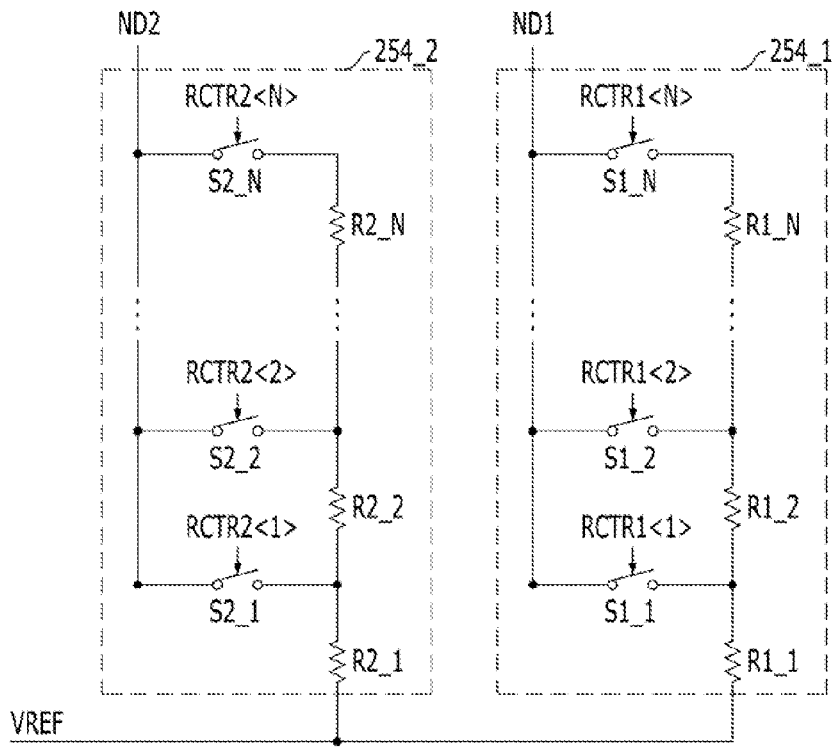
FIG. 6 is a detailed diagram illustrating first and second resistor units shown in FIG. 4.

FIG. 6 is a detailed diagram illustrating the first and second resistor units 254_1 and 254_2 shown in FIG. 4.

The first resistor unit 254_1 may be designed to include a plurality of resistors R1_1 to R1_N connected in series and a plurality of switches S1_1 to S1_N. The respective switches S1_1 to S1_N are turned on/off in response to corresponding bits of a control code RCTR1<1:N>. Specifically, the first resistor unit 254_1 may be designed in such a manner that, when only a K-th bit RCTR1<K> corresponding to a K-th switch S1_K (1≤K≤N) in the control code RCTR1<1:N> is at a high level and the other bits are at a low level, only the K-th switch S1_K is turned on, and the other switches are turned off. In this case, the entire resistance value of the first resistor unit 254_1 corresponds to the sum of resistance values of the first to K-th resistors R1_1 to R1_K, that is, R1_1+R1_2+ . . . +R1_K. For example, when only the first bit RCTR1<1> corresponding to the first switch S1_1 in the control code RCTR1<1:N> is at a high level and the other bits RCTR1<2:N> are at a low level, only the first switch S1_1 is turned on, and the other switches S1_2 to S1_N are turned off. In this case, the entire resistance value of the first resistor unit 254_1 corresponds to the resistance value of the first resistor R1_1. As another example, when only the second bit RCTR1<2> corresponding to the second switch S1_2 in the control code 254_1 is at a high level and the other bits RCTR1<1> and RCTR1<3:N> are at a low level, only the second switch S1_2 is turned on, and the other switches S1_1 and S1_3 to S1_N are turned off. In this case, the entire resistance value of the first resistor unit 254_1 corresponds to the sum of resistance values of the first and second resistors R1_1 and R1_2, that is, R1_1+R1_2. Meanwhile, the control code RCTR1<1:N> corresponds to a ratio of the activation period lengths of the first up/down signal UP1/DN1 and the first second up/down signal UP2/DN2. Specifically, when the phase of the first selected periodic wave φSEL1 leads the phase of the reference wave REF_CLK and the phase of the reference wave REF_CLK leads the phase of the second selected periodic wave φSEL2, the control code RCTR1<1:N> corresponding to a ratio occupied by the activation period length of the second up signal UP2 in the sum of the activation period lengths of the first down signal DN1 and the second up signal UP2 is inputted. On the other hand, when the phase of the second selected periodic wave φSEL2 leads the phase of the reference wave REF_CLK and the phase of the reference wave REF_CLK leads the phase of the first selected periodic wave φSEL1, the control code RCTR1<1:N> corresponding to a ratio occupied by the activation period length of the second down signal DN2 in the sum of the activation period lengths of the first up signal UP1 and the second down signal DN2 is inputted.

The second resistor unit 254_2 may be designed to include a plurality of resistors R2_1 to R2_N connected in series and a plurality of switches S2_1 to S2_N turned on/off in response to corresponding bits of a control code RCTR2<1:N>, like the first resistor unit 254_1. Meanwhile, the control code RCTR2<1:N> corresponds to a ratio of the activation period lengths of the first up/down signal UP1/DN1 and the second up/down signal UP2/DN2. Specifically, when the phase of the first selected periodic wave φSEL1 leads the phase of the reference wave REF_CLK and the phase of the reference wave REF_CLK leads the phase of the second selected periodic wave φSEL2, the control code RCTR2<1:N> corresponding to a ratio occupied by the activation period length of the first down signal DN1 in the sum of the activation period lengths of the first down signal DN1 and the second up signal UP2 is inputted. On the other hand, when the phase of the second selected periodic wave φSEL2 leads the phase of the reference wave REF_CLK and the phase of the reference wave REF_CLK leads the phase of the first selected periodic wave φSEL1, the control code RCTR2<1:N> corresponding to a ratio occupied by the activation period length of the first up signal UP1 in the sum of the activation period lengths of the first up signal UP1 and the second down signal DN2 is inputted.

For example, when ① the first resistor unit 254_1 includes five resistors R1_1 to R1_5 having the same resistance value and five switches S1_1 to S1_5, ② the second resistor unit 254_2 includes five resistors R2_1 to R2_5 having the same resistance value and five switches S2_1 to S2_5, ③ the phase of the first selected periodic wave φSEL1 leads the phase of the reference wave REF_CLK and the phase of the reference wave REF_CLK leads the phase of the second selected periodic wave φSEL2, ④ a ratio occupied by the activation period length of the second up signal UP2 in the sum of the activation period lengths of the first down signal DN1 and the second up signal UP2 is 2/5, and ⑤ a ratio occupied by the activation period length of the first down signal DN1 in the sum of the activation period lengths of the first down signal DN1 and the second up signal UP2 is 3/5, the control code RCTR1<1:5> corresponding to '01000' and the control code RCTR2<1:5> corresponding to '00100' may be inputted.

Figure 7:
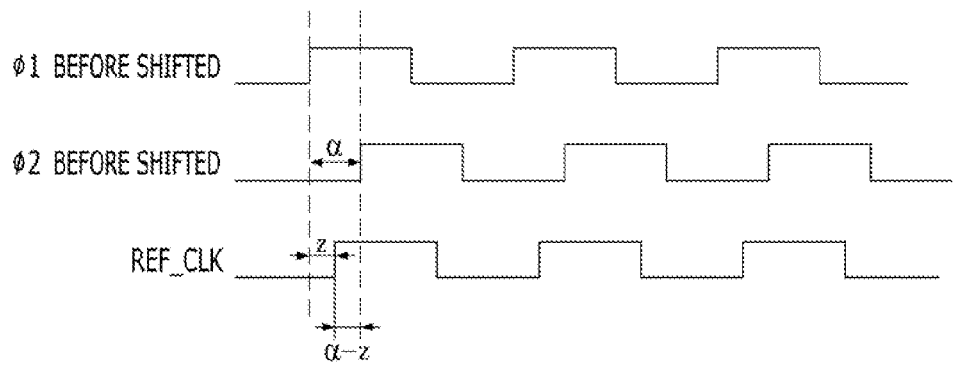
FIG. 7 is a waveform diagram illustrating the waveforms of periodic waves which are inputted to first and second phase comparison units shown in FIG. 4.

FIG. 7 is a waveform diagram illustrating the waveforms of the first selected periodic wave φSEL1, the second selected periodic wave φSEL2, and the reference wave REF_CLK which are inputted to the first and second phase comparison units 252_1 and 252_2 shown in FIG. 4. In FIG. 7, it is assumed that the first selected periodic wave φSEL1 is the first periodic wave φ1 and the second selected periodic wave φSEL2 is the second periodic wave φ2 having a phase difference α from the first periodic wave φ1. The phase of reference wave REF_CLK is positioned between the phases of the first and second periodic wave φ1 and φ2. When a phase difference between the first periodic wave φ1 and the reference wave REF_CLK is represented by Z, a phase difference between the reference wave REF_CLK and the second periodic wave φ2 corresponds to α−Z.

Figure 8:
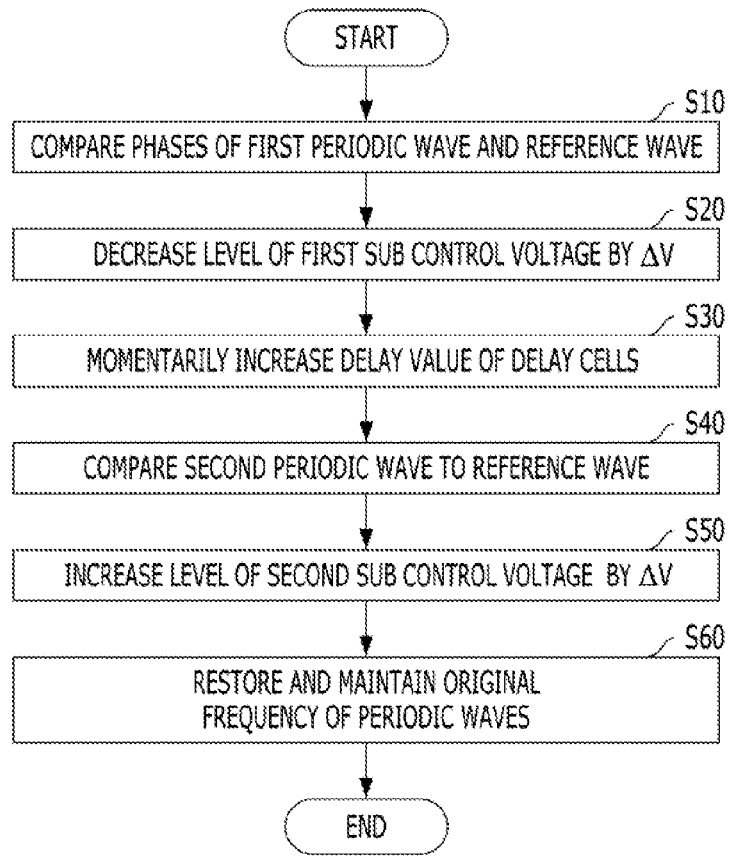
FIG. 8 is a flowchart illustrating a process in which the phases of periodic waves are shifted by the integrated circuit shown in FIG. 4.

FIG. 8 is a flowchart illustrating a process in which the phases of periodic waves φ1 to φ8 are shifted by the integrated circuit shown in FIG. 4.

The ring oscillator 150 receives the main control voltage VMAIN, the first sub control voltage VSUB1 corresponding to the reference voltage level VREF, and the second sub control voltage VSUB2, and generates eight periodic waves φ1 to φ8. For convenience of description, it is assumed that the eight periodic waves φ1 to φ8 generated by the ring oscillator 150 have a frequency of 10 MHz.

The selection unit 251 of the phase comparison circuit 250 selects two periodic waves among the eight periodic waves φ1 to φ8 and outputs the selected periodic waves to the first and second phase comparison units 252_1 and 252_2, respectively. Hereafter, a case in which the selection unit 251 selects the first and second periodic waves φ1 and φ2 among the eight periodic waves φ1 to φ8, the first periodic wave φ1 is outputted to the first phase comparison unit 252_1, and the second periodic wave φ2 is outputted to the second phase comparison unit 252_2 will be taken as an example, for convenience of description.

The first phase comparison unit 252_1 compares the phase of the reference wave REF_CLK, positioned between the phases of the first and second periodic waves φ1 and φ2, to the phase of the first periodic wave φ1, and generates the first down signal DN1 having an activation period length corresponding to the phase difference therebetween, at step S10.

Since the phase of the first periodic wave φ1 leads the phase of the second periodic wave φ2, the first phase comparison unit 252_1 performs the comparison operation before the second phase comparison unit 252_2.

The first charge pump 253_1 draws a current corresponding to the activation period length of the first down signal DN1 from the first node ND1. Furthermore, the first resistor unit 254_1 has a resistance value corresponding to a ratio occupied by the activation period length of the second up signal UP2 in the sum of the activation period lengths of the first down signal DN1 and the second up signal UP2 based on the reference resistance value, as expressed by Equation 1 above. As a result, the voltage of the first node ND1, that is, the level of the first sub control voltage VSUB1 decreases by ΔV from the reference voltage level VREFF, as expressed by the following equation, at step S20:

$$VSUB1 = VREF - I\_UNIT*LENTH\_EN\_DN1*R1 = VREF - I\_UNIT*LENTH\_EN\_DN1*R\_REF*\{LENTH\_EN\_UP2/(LENTH\_EN\_DN1+LENTH\_EN\_UP2)\}.$$

When the level of the first sub control voltage VSUB1 decreases, the amount of current flowing in the delay cells 151_1 to 151_4 of the ring oscillator 150 decreases, and the delay value of the delay cells 151_1 to 151_4 increases. Accordingly, the phase difference between the periodic waves φ1 to φ8 generated by the delay cells 151_1 to 151_4 increases, and the frequency of the first periodic wave φ1 may momentarily decrease. For convenience of description, it is assumed that the frequency of the first periodic wave φ1 may momentarily decrease from 10 MHz to 8 MHz. As a result, a rising edge of the first periodic wave φ1 occurs later than when the frequency is 10 MHz, at step S30.

Meanwhile, after a predetermined short time passes from a time point when the level of the first sub control voltage VSUB1 starts to decrease, the second phase comparison unit 252_2 compares the phases of the reference wave REF_CLK and the second periodic wave φ2, and generates the second up signal UP2 having an activation period length corresponding to a phase difference, at step S40.

The second charge pump 253_2 outputs a current corresponding to the activation period length of the second up signal UP2 to the second node ND2. Furthermore, the second resistor unit 254_2 has a resistance value corresponding to a ratio occupied by the activation period length of the first down signal DN1 in the sum of the activation period lengths of the first down signal DN1 and the second up signal UP2 based on the reference resistance value, as expressed by Equation 3 above. As a result, the voltage of the second node ND2, that is, the level of the second sub control voltage VSUB2 increases by ΔV from the reference voltage level VREF, as expressed by the following equation:

$$VSUB2 = VREF + I\_UNIT*LENTH\_EN\_UP2*R2 = VREF + I\_UNIT*LENTH\_EN\_UP2*R\_REF*\{LENTH\_EN\_DN1/(LENTH\_EN\_DN1+LENTH\_EN\_UP2)\}.$$

When the level of the second sub control voltage VSUB2 increases, the amount of current flowing in the delay cells 151_1 to 151_4 of the ring oscillator 150 is increased to decrease the delay value of the delay cells 151_1 to 151_4. Here, since the voltage variation of the second sub control voltage VSUB2 has a different sign from the voltage variation of the first sub control voltage VSUB1 but has the same amount as the voltage variation of the first sub control voltage VSUB1, the current flowing in the delay cells 151_1 to 151_4 increases by the same amount as the current variation when the level of the first sub control voltage VSUB1 decreases by ΔV. As a result, a current having the same amount as before the level of the first sub control voltage VSUB1 was changed is passed to the delay cells 151_1 to 151_4, and the delay value of the delay cells 151_1 to 151_4 is controlled to the same delay value as before the level of the first sub control voltage VSUB1 was changed, at step S50. Accordingly, the periodic waves ϕ1 to ϕ8 outputted from the respective delay cells 151_1 to 151_4 have the same frequency of 10 MHz as before the level of the first sub control voltage VSUB1 was changed. Here, since an interval (first period) from a time point when the decrease of the first sub control voltage VSUB1 starts to a time point when the increase of the second sub control voltage VSUB2 ends corresponds to a small interval, the frequency of the periodic waves ϕ1 to ϕ8 outputted from the respective delay cells 151_1 to 151_4 may momentarily decrease from 10 MHz to 8 MHz, and then restore to 10 MHz, at step S60.

As a result, the frequency of the periodic waves ϕ1 to ϕ8 has the same amount of 10 MHz as before the level of the first sub control voltage VSUB1 was decreased, and the phases of the periodic waves ϕ1 to ϕ8 are shifted right from when the frequency is 10 MHz.

In accordance with the embodiments of the present invention, as the ring oscillator and the phase controller having a simple structure are used, periodic waves may be generated and the phases of the generated periodic waves may be shifted, while limiting an increase in the chip area.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. An integrated circuit comprising:
a ring oscillator configured to include one or more delay cells having a delay value and to generate two or more periodic waves;
a first phase controller configured to compare the phase of a first selected periodic wave, selected among the periodic waves, to the phase of a reference wave, and to change the delay value of the delay cells from a first delay value to a second delay value based on a first comparison signal, which corresponds to a phase difference between the phase of the first selected periodic wave and the phase of the reference wave; and
a second phase controller configured to compare the phase of a second selected periodic wave, selected among the periodic waves, to the phase of the reference wave, and to restore the delay value of the delay cells from the second delay value to the first delay value based on a second comparison signal, which corresponds to a phase difference between the phase of the second selected periodic wave and the phase of the reference wave,
wherein a period required for restoring the delay value of the delay cells to the first delay value corresponds to an interval from a time point when an activation period of the first comparison signal starts to a time point when an activation period of the second comparison signal ends.

2. The integrated circuit of claim 1, wherein each of the delay cells comprises:
a delay unit configured to delay an input signal by the delay value thereof; and
a current source unit configured to control the amount of an operation current flowing in the delay unit based on control of the first and second phase controllers,
wherein the delay value of the delay cells corresponds to an amount of the operation current.

3. The integrated circuit of claim 2, wherein the current source unit comprises:
a first current source configured to control the amount of a first operation current based on a main control voltage;
a second current source configured to control the amount of a second operation current based on a first sub control voltage; and
a third current source configured to control the amount of a third operation current based on a second sub control voltage.

4. The integrated circuit of claim 3, wherein the phase of the reference wave is positioned between the phases of the first and second selected periodic waves,
the first phase controller comprises a first phase comparison unit configured to compare the phases of the first selected periodic wave and the reference wave and output the first comparison signal corresponding to a phase difference between the first selected periodic wave and the reference wave; and a first sub control voltage control unit configured to decrease the level of the first sub control voltage by an amount corresponding to a difference between the first and second delay values in response to the first comparison signal, and
the second phase controller comprises a second phase comparison unit configured to compare the phases of the second selected periodic wave and the reference wave and output the second comparison signal corresponding to a phase difference between the second selected periodic wave and the reference wave; and a second sub control voltage control unit configured to increase the level of the second sub control voltage by an amount corresponding to a difference between the first and second delay values in response to the second comparison signal.

5. The integrated circuit of claim 4, wherein the first comparison signal comprises a first up signal having an activation period length corresponding to a phase difference between the reference wave and the first selected periodic wave when the phase of the reference wave leads the phase of the first selected periodic wave and a first down signal having an activation period length corresponding to a phase difference between the first selected periodic wave and the reference wave when the phase of the first selected periodic wave leads the phase of the reference wave, and
the second comparison signal comprises a second up signal having an activation period length corresponding to a phase difference between the reference wave and the second selected periodic wave when the phase of the reference wave leads the phase of the second selected periodic wave and a second down signal having an activation period length corresponding to a phase difference between the second selected periodic wave and the reference wave when the phase of the second selected periodic wave leads the phase of the reference wave.

6. The integrated circuit of claim 5, wherein the first sub control voltage control unit comprises:
a first charge pump configured to supply a current corresponding to the activation period length of the first up signal to a first node or draw a current corresponding to the activation period length of the first down signal from the first node; and a first resistor unit having one end configured to receive a reference voltage and the other end coupled to the first node and having a resistance value which is adjusted to a resistance value corresponding to a ratio occupied by the activation period length of the second up signal in the sum of the activation period lengths of the first down signal and the second up signal based on a reference resistance value or a resistance value corresponding to a ratio occupied by the activation period length of the second down signal in the sum of the activation period lengths of the first up signal and the second down signal based on the reference resistance value, the second sub control voltage control unit comprises:

a second charge pump configured to supply a current corresponding to the activation period length of the second up signal to a second node or draw a current corresponding to the activation period length of the second down signal from the second node; and a second resistor unit having one end configured to receive the reference voltage and the other end coupled to the second node and having a resistance value which is adjusted to a resistance value corresponding to a ratio occupied by the activation period length of the first down signal in the sum of the activation period lengths of the first down signal and the second up signal based on the reference resistance value or a resistance value corresponding to a ratio occupied by the activation period length of the first up signal in the sum of the activation period lengths of the first up signal and the second down signal based on the reference resistance value, and the first sub control voltage is the voltage of the first node, and the second sub control voltage is the voltage of the second node.

7. An integrated circuit comprising:

a ring oscillator configured to include one or more delay cells having a delay value and to generate two or more periodic waves; and a phase controller configured to change the delay value of the delay cells from a first delay value to a second delay value during a first period, and then to restore the changed delay value to the first delay value, thereby shifting phases of the periodic waves, wherein the phase controller changes the delay value of the delay cells from the first delay value to the second delay value in response to a phase comparison result of one periodic wave among the periodic waves and a reference wave, and changes the delay value of the delay cells from the second delay value to the first delay value in response to a phase comparison result of another periodic wave among the periodic waves and the reference wave.

8. The integrated circuit of claim 7, wherein the phase controller changes the delay value of the respective delay cells by controlling an amount of an operation current from a first current amount corresponding to the first delay value to a second current amount corresponding to the second delay value.

9. The integrated circuit of claim 8, wherein each of the delay cells comprises:

a delay unit configured to delay an input signal by the delay value thereof; and a current source unit configured to control an amount of the operation current based on control of the phase controller.

10. The integrated circuit of claim 9, wherein the current source unit comprises:

a first current source configured to control the amount of a first current based on a main control voltage;

a second current source configured to control the amount of a second current based on a first sub control voltage; and a third current source configured to control the amount of a third current based on a second sub control voltage.

11. The integrated circuit of claim 10, wherein the phase controller decreases the level of the first sub control voltage by an amount corresponding to a difference between the first and second current amounts, during the first period, and then increases the level of the second sub control voltage by an amount corresponding to the difference between the first and second current amounts.

12. The integrated circuit of claim 10, wherein the phase controller comprises:

a phase comparison circuit configured to compare the phase of a first selected periodic wave, selected among the periodic waves, to the phase of the reference wave to output a first comparison signal corresponding to a phase difference between the phase of the first selected periodic wave and the phase of the reference wave, and compare the phase of a second selected periodic wave, selected among the periodic waves, to the phase of the reference wave to output a second comparison signal corresponding to a phase difference between the phase of the second selected periodic wave and the phase of the reference wave; and a sub control voltage control unit configured to decrease the level of the first sub control voltage by an amount corresponding to a difference between the first current amount and the second current amount in response to the first comparison signal, and then increase the level of the second sub control voltage by an amount corresponding to the difference between the first and second current amounts in response to the second comparison signal, and the first period corresponds to an interval from a time point when the activation period of the first comparison signal starts and a time point when the activation period of the second comparison signal ends.

13. The integrated circuit of claim 12, wherein the first comparison signal comprises a first up signal having an activation period length corresponding to a phase difference between the reference wave and the first selected periodic wave when the phase of the reference wave leads the phase of the first selected periodic wave, and a first down signal having an activation period length corresponding to a phase difference between the first selected periodic wave and the reference wave when the phase of the first selected periodic wave leads the phase of the reference wave, and the second comparison signal comprises a second up signal having an activation period length corresponding to a phase difference between the reference wave and the second selected periodic wave when the phase of the reference wave leads the phase of the second selected periodic wave, and a second down signal having an activation period length corresponding to a phase difference between the second selected periodic wave and the reference wave when the phase of the second selected periodic wave leads the phase of the reference wave.

14. The integrated circuit of claim 13, wherein the sub control voltage control unit comprises:

a first charge pump configured to supply a current corresponding to the activation period length of the first up signal to a first node or draw a current corresponding to the activation period length of the first down signal from the first node;

a second charge pump configured to supply a current corresponding to the activation period length of the second up signal to a second node or draw a current corresponding to the activation period length of the second down signal from the second node;

a first resistor unit having one end configured to receive a reference voltage and the other end coupled to the first node and having a resistance value which is adjusted to a resistance value corresponding to a ratio occupied by the activation period length of the second up signal in the sum of the activation period lengths of the first down signal and the second up signal based on a reference resistance value or a resistance value corresponding to a ratio occupied by the activation period length of the second down signal in the sum of the activation period lengths of the first up signal and the second down signal based on the reference resistance value; and a second resistor unit having one end configured to receive the reference voltage and the other end coupled to the second node and having a resistance value which is adjusted to a resistance value corresponding to a ratio occupied by the activation period length of the first down signal in the sum of the activation period lengths of the first down signal and the second up signal based on the reference resistance value or a resistance value corresponding to a ratio occupied by the activation period length of the first up signal in the sum of the activation period lengths of the first up signal and the second down signal based on the reference resistance value, and the first sub control voltage is the voltage of the first node, and the second sub control voltage is the voltage of the second node.

15. An integrated circuit comprising:

a ring oscillator configured to include one or more delay cells having a delay value and to generate two or more periodic waves; and a phase controller configured to change an operation current of the delay cells from a first current amount to a second current amount, during a first period, and then to restore the changed operation current to the first current amount, wherein each of the delay cells comprises:

a delay unit configured to delay an input signal by the delay value thereof;

a first current source configured to control the amount of a first current based on a main control voltage;

a second current source configured to control the amount of a second current based on a first sub control voltage; and a third current source configured to control the amount of a third current based on a second sub control voltage, wherein the phase controller decreases the level of the first sub control voltage by an amount corresponding to a difference between the first and second current amounts, during the first period, and then increases the level of the second sub control voltage by an amount corresponding to the difference between the first and second current amounts.

16. The integrated circuit of claim 15, wherein the phase controller comprises:

a phase comparison circuit configured to compare the phase of a first selected periodic wave, selected among the periodic waves, to the phase of a reference wave to output a first comparison signal corresponding to a phase difference between the phase of the first selected periodic wave and the phase of the reference wave, and compare the phase of a second selected periodic wave, selected among the periodic waves, to the phase of the reference wave to output a second comparison signal corresponding to a phase difference between the phase of the second selected periodic wave and the phase of the reference wave; and a sub control voltage control unit configured to decrease the level of the first sub control voltage by an amount corresponding to a difference between the first current amount and the second current amount in response to the first comparison signal, and then increase the level of the second sub control voltage by an amount corresponding to the difference between the first and second current amounts in response to the second comparison signal, and the first period corresponds to an interval from a time point when the activation period of the first comparison signal starts and a time point when the activation period of the second comparison signal ends.

17. The integrated circuit of claim 16, wherein the first comparison signal comprises a first up signal having an activation period length corresponding to a phase difference between the reference wave and the first selected periodic wave when the phase of the reference wave leads the phase of the first selected periodic wave, and a first down signal having an activation period length corresponding to a phase difference between the first selected periodic wave and the reference wave when the phase of the first selected periodic wave leads the phase of the reference wave, and the second comparison signal comprises a second up signal having an activation period length corresponding to a phase difference between the reference wave and the second selected periodic wave when the phase of the reference wave leads the phase of the second selected periodic wave, and a second down signal having an activation period length corresponding to a phase difference between the second selected periodic wave and the reference wave when the phase of the second selected periodic wave leads the phase of the reference wave.

18. The integrated circuit of claim 17, wherein the sub control voltage control unit comprises:

a first charge pump configured to supply a current corresponding to the activation period length of the first up signal to a first node or draw a current corresponding to the activation period length of the first down signal from the first node;

a second charge pump configured to supply a current corresponding to the activation period length of the second up signal to a second node or draw a current corresponding to the activation period length of the second down signal from the second node;

a first resistor unit having one end configured to receive a reference voltage and the other end coupled to the first node and having a resistance value which is adjusted to a resistance value corresponding to a ratio occupied by the activation period length of the second up signal in the sum of the activation period lengths of the first down signal and the second up signal based on a reference resistance value or a resistance value corresponding to a ratio occupied by the activation period length of the second down signal in the sum of the activation period lengths of the first up signal and the second down signal based on the reference resistance value; and a second resistor unit having one end configured to receive the reference voltage and the other end coupled to the second node and having a resistance value which is adjusted to a resistance value corresponding to a ratio occupied by the activation period length of the first down signal in the sum of the activation period lengths of the first down signal and the second up signal based on the reference resistance value or a resistance value corresponding to a ratio occupied by the activation period length of the first up signal in the sum of the activation period lengths of the first up signal and the second down signal based on the reference resistance value, and the first sub control voltage is the voltage of the first node, and the second sub control voltage is the voltage of the second node.

\* \* \* \* \*